(12) United States Patent
Gurcan

(10) Patent No.: US 8,304,931 B2
(45) Date of Patent: Nov. 6, 2012

(54) CONFIGURABLE POWER SUPPLY INTEGRATED CIRCUIT

(75) Inventor: Hakan Ates Gurcan, Los Gatos, CA (US)

(73) Assignee: Decicon, Inc., Santa Clara, CA (US)

( * ) Notice: Subject to any disclaimer, the term of this patent is extended or adjusted under 35 U.S.C. 154(b) by 20 days.

(21) Appl. No.: 11/957,357

(22) Filed: Dec. 14, 2007

(65) Prior Publication Data

US 2008/0150368 A1 Jun. 26, 2008

Related U.S. Application Data

(60) Provisional application No. 60/870,557, filed on Dec. 18, 2006.

(51) Int. Cl.
*H02J 1/10* (2006.01)
*G05F 1/00* (2006.01)
*G05F 1/10* (2006.01)

(52) U.S. Cl. ............................ 307/82; 307/85

(58) Field of Classification Search .............. 307/82, 307/85
See application file for complete search history.

(56) References Cited

U.S. PATENT DOCUMENTS

| | | | |
|---|---|---|---|
| 2,220,099 A | 11/1940 | Fritz Guenther et al. | |
| 3,020,099 A | 2/1962 | Smith | |
| 3,541,446 A | 11/1970 | Prozeller | |
| 4,473,744 A | 9/1984 | Mizokami | |
| 6,046,577 A | 4/2000 | Rincon et al. | |
| 6,160,325 A | 12/2000 | Turvey | |
| 6,201,375 B1 | 3/2001 | Larson et al. | |
| 6,246,221 B1 | 6/2001 | Xi | |
| 6,246,222 B1 * | 6/2001 | Nilles et al. | 323/283 |
| 6,373,297 B1 | 4/2002 | Lee et al. | |
| 6,388,433 B2 | 5/2002 | Marty | |
| 6,437,638 B1 | 8/2002 | Coles et al. | |
| 6,465,994 B1 | 10/2002 | Xi | |
| 6,674,274 B2 * | 1/2004 | Hobrecht et al. | 323/285 |
| 6,677,735 B2 | 1/2004 | Xi | |
| 6,696,882 B1 * | 2/2004 | Markowski et al. | 327/531 |
| 6,703,815 B2 | 3/2004 | Biagi | |
| 6,839,252 B2 * | 1/2005 | Tai et al. | 363/65 |
| 6,856,124 B2 | 2/2005 | Dearn | |
| 6,933,772 B1 | 8/2005 | Banerjee et al. | |
| 6,977,489 B2 * | 12/2005 | Isham | 323/272 |
| 6,989,659 B2 | 1/2006 | Menegoli et al. | |
| 7,009,348 B2 * | 3/2006 | Mogilner et al. | 315/307 |
| 7,102,394 B1 | 9/2006 | Wilson et al. | |
| 7,109,691 B2 * | 9/2006 | Brooks et al. | 323/282 |

(Continued)

OTHER PUBLICATIONS

U.S. Appl. No. 12/729,142, filed Mar. 22, 2010, Gurcan.
Austria Micro Systems—Liberty: Power Management IP Library from Mobile Applications—Analog LDO—Low Power, Low Noise, Low Dropout, 150mA Voltage Regulator, Feb. 2002, pp. 1-4.

(Continued)

*Primary Examiner* — Adi Amrany
(74) *Attorney, Agent, or Firm* — Kilpatrick Townsend & Stockton LLP

(57) ABSTRACT

A power integrated circuit includes, in part, a multitude of controllers, a multitude of pulse-width generators, a multitude of output stages and a configuration matrix. Each controller is adapted to be responsive to a feedback signal and a reference signal to generate a control signal carrying pulse width information. Each control signal causes a difference between an associated output voltage feedback signal and the reference signal to be less than a predefined value. Each pulse-width generator is associated with and responsive to a different one of the controllers to generate a pulse-width modulated signal in response. The configuration matrix selectively couples the plurality of pulse-width generators to the output stages.

7 Claims, 9 Drawing Sheets

U.S. PATENT DOCUMENTS

| | | | |
|---|---|---|---|
| 7,141,956 B2 * | 11/2006 | Chapuis | 323/283 |
| 7,167,054 B1 * | 1/2007 | Dening et al. | 330/297 |
| 7,170,352 B1 | 1/2007 | Caldwell | |
| 7,262,658 B2 * | 8/2007 | Ramaswamy et al. | 330/251 |
| 7,274,182 B2 * | 9/2007 | Huang | 323/284 |
| 7,304,464 B2 | 12/2007 | Weng et al. | |
| 7,315,153 B2 * | 1/2008 | Tazawa et al. | 323/272 |
| 7,327,127 B2 | 2/2008 | Ho | |
| 7,333,348 B2 * | 2/2008 | Horiuchi et al. | 363/16 |
| 7,342,392 B2 | 3/2008 | Liao | |
| 7,348,840 B2 * | 3/2008 | Magrath et al. | 330/10 |
| 7,358,706 B2 * | 4/2008 | Lys | 323/222 |
| 7,378,827 B2 * | 5/2008 | Stoichita | 323/285 |
| 7,394,236 B2 * | 7/2008 | Chapuis et al. | 323/283 |
| 7,397,226 B1 | 7/2008 | Mannama et al. | |
| 7,402,985 B2 | 7/2008 | Zlatkovic | |
| 7,414,471 B2 * | 8/2008 | Krishnan et al. | 330/251 |
| 7,486,058 B2 | 2/2009 | Szepesi | |
| 7,501,801 B2 | 3/2009 | Brown et al. | |
| 7,531,996 B2 | 5/2009 | Yang et al. | |
| 2006/0198165 A1 * | 9/2006 | O'Driscoll et al. | 363/13 |
| 2007/0114985 A1 * | 5/2007 | Latham et al. | 323/283 |
| 2008/0150500 A1 * | 6/2008 | Gurcan | 323/271 |
| 2008/0157740 A1 | 7/2008 | Gurcan | |
| 2008/0174289 A1 | 7/2008 | Gurcan et al. | |
| 2008/0278230 A1 * | 11/2008 | Kost et al. | 330/10 |
| 2009/0015066 A1 * | 1/2009 | Guo et al. | 307/31 |
| 2009/0015218 A1 * | 1/2009 | O'Driscoll et al. | 323/267 |

OTHER PUBLICATIONS

Linear Technology—LTC3025 300mA Micropower VLDO Linear Regulator, Data Sheet, Copyright 2004, pp. 1-12, Linear Technology Corp.

Non-Final Office Action for U.S. Appl. No. 11/957,305, mailed on Nov. 13, 2009, 10 pages.

Non-Final Office Action for U.S. Appl. No. 11/956,070, mailed on Sep. 22, 2009, 9 pages.

Non-Final Office for U.S. Appl. No. 11/939,377, mailed on Nov. 16, 2009, 8 pages.

Non-Final Office Action for U.S. Appl. No. 11/939,377, mailed on Jul. 23, 2010, 18 pages.

Final Office Action for U.S. Appl. No. 11/957,305, mailed on Aug. 23, 2010, 17 pages.

Notice of Allowance for U.S. Appl. No. 11/957,305, mailed on Feb. 11, 2011, 7 pages.

Non-Final Office Action for U.S. Appl. No. 12/729,142, mailed on Jan. 25, 2011, 16 pages.

Non-Final Office Action for U.S. Appl. No. 11/939,377, mailed on Mar. 31, 2011, 15 pages.

Notice of Allowance for U.S. Appl. No. 12/729,142, mailed on Jun. 27, 2011, 8 pages.

Final Office Action for U.S. Appl. No. 11/939,377, mailed on Dec. 22, 2011, 17 pages.

* cited by examiner

US 8,304,931 B2

CONFIGURABLE POWER SUPPLY INTEGRATED CIRCUIT

CROSS-REFERENCES TO RELATED APPLICATIONS

The present application claims benefit under 35 USC 119 (e) of U.S. Provisional Application No. 60/870,557, filed on Dec. 18, 2006, entitled "Configurable Power Supply Integrated Circuit," the content of which is incorporated herein by reference in its entirety.

The present application is related to and incorporates by reference the entire contents of the following two applications:

application Ser. No. 11/956,070, filed Dec. 13, 2007, entitled "Hybrid Low Dropout Voltage Regulator Circuit"; and
application Ser. No. 11/957,305, filed Dec. 14, 2007, entitled "Hybrid DC-DC Switching Regulator Circuit".

BACKGROUND OF THE INVENTION

The present invention relates to electronic circuits, and more particularly to power supply integrated circuits.

In integrated circuits (IC), there is often a need to generate a regulated DC voltage from a unregulated DC supply voltage. One known circuit for achieving this is commonly referred to as pulse width modulated (PWM) regulator. Another known circuit for achieving this is commonly referred to as Linear Regulators. Both types of regulator often use a feedback loop to maintain its output voltage equal to a reference voltage and to maintain stability in the loop.

BRIEF SUMMARY OF THE INVENTION

A power integrated circuit, in accordance with one embodiment of the present invention, includes, in part, a multitude of controllers, a multitude of pulse-width generators, a multitude of output stages and a configuration matrix. Each controller is adapted to be responsive to a feedback signal and a reference signal to generate a control signal carrying pulse width information. Each control signal causes a difference between an associated feedback signal and the reference signal to be less than a predefined value. Each pulse-width generator is associated with and responsive to a different one of the controllers to generate a pulse-width modulated signal in response. The configuration matrix selectively couples the plurality of pulse-width generators to the output stages.

In one embodiment, at least one of the feedback voltages is generated by dividing an output voltage supplied by an associated output stage. In another embodiment, the feedback voltage represents an output voltage supplied by an associated output stage. In one embodiment, each pulse-width generator includes a sample-and-hold circuit, and a comparator responsive to the sample-and-hold circuit.

A power integrated circuit, in accordance with another embodiment of the present invention, includes, in part, a digital control block, a multitude of pulse-width generators, a multitude of output stages and a configuration matrix. The digital control block is responsive to feedback signals and a reference signal to generate a multitude of control signals. Each pulse-width generator is associated with and responsive to a different one of a plurality of control signals supplied by the digital control block. The configuration matrix selectively couples the plurality of pulse-width generators to the output stages.

In one embodiment, the digital control block includes, in part, an analog-to-digital converter, a digital control engine responsive to the analog-to-digital converter and adapted to cause the difference between an associated feedback voltage and the reference voltage to be less than a predefined value, and a digital-to-analog converter responsive to the digital control engine. The digital control block optionally includes a memory storing configuration data, and a clock and timing signal generation block. In one embodiment, the digital control block is generates a biasing signal used by other blocks disposed in the power integrated circuit. In one embodiment, a pulse-width generators includes, in part, a sample-and-hold circuit; and a comparator responsive to the sample-and-hold block.

An integrated circuit, in accordance with another embodiment of the present invention, a digital control block, a multitude of pulse-width generators, a multitude of output stages, and a number of configuration matrices. The digital control block is responsive to a plurality of voltage feedback signals and a reference signal to generate a multitude of control signals. Each pulse-width generator is associated with and responsive to a different one of the multitude of control signals supplied by the digital control block. A first configuration matrix selectively couples the pulse-width generators to the output stages. A second configuration matrix receives a multitude of feedback current signals from the output stages and selectively delivers the current feedback signals to associated pulse width generators. A third configuration matrix receives the voltage feedback signals and selectively delivers the voltage feedback signals to associated pulse width generators.

DETAILED DESCRIPTION OF THE INVENTION

Figure 1:
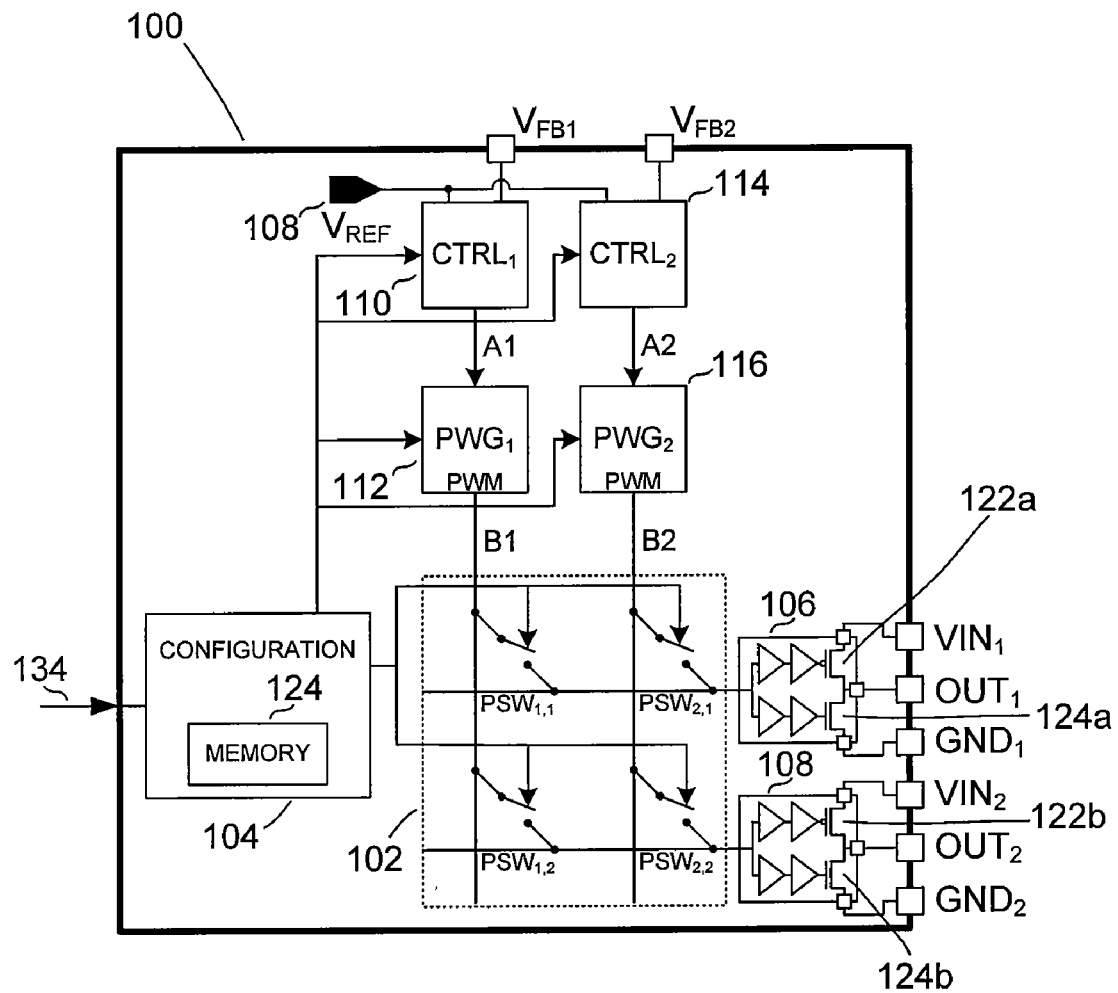
FIG. 1 is a block diagram of a configurable power supply voltage regulator integrated circuit, in accordance with one exemplary embodiment of the present invention.

FIG. 1 is a block diagram of a configurable power supply voltage regulator integrated circuit 100, in accordance with one exemplary embodiment of the present invention. Configurable power supply voltage regulator integrated circuit, referred to alternatively herein below as configurable regulator or regulator, 100 is shown as having two output stages. It is understood that a configurable power supply voltage regulator integrated circuit, in accordance with the present invention, may have any number of output stages and voltages. Furthermore, although the following description is provided with reference to a buck regulator, it is understood that any other voltage regulation technique, such as boost, buck-boost, linear or otherwise may be used.

Regulator 100 is shown as including, in part, loop controllers 110, 114, pulse-width generators 112, 116, configuration matrix 102, and output stages 106 and 108. Regulator 100 is also shown as having disposed therein a configuration block 104. It is understood however that configuration block 104 may be external to regulator 100. Each of the output stages includes a unit sized high side switch and a unit sized low side switch, with each switch having an associated driver. For example, output stage 106 is shown as including a high side switch 122a and a low side switch 124a, and output stage 108 is shown as including a high side switch 122b and a low side switch 124b. The unit size is defined with respect to the performance parameter targets of the regulator. The unit size can be chosen to give the best efficiency at, for example 100 mA load current. Output Stages 106 and 108 do not need to have identical sizes. For example the switches of Output Stage 106 may be sized for 100 mA load current, whereas the switches of Output Stage 108 may be sized for 200 mA.

As described further below, each loop controller receives a feedback voltage and a reference voltage, and in response generates a signal applied to the loop controller's associated pulse-width generator. For example, loop controller 110 is shown as receiving voltage feedback signal $V_{FB1}$ and reference voltage $V_{REF}$, and in response generating control signal A1 applied to the pulse width generator (PWG) 112. Similarly, loop controller 114 is shown as receiving voltage feedback signal $V_{FB2}$ and reference voltage $V_{REF}$, and in response generating control signal A2 applied to the pulse width generator (PWG) 116. PWGs 112 and 116 generate pulse-width modulated (PWM) signals B1 and B2 at their respective outputs terminals in response. Configuration Matrix (CM) 102 includes a multitude of switches adapted to selectively supply PWM signals B1 and B2 to output stages 106 and 108.

In one embodiment, configuration block 104 includes a non-volatile memory 124 to store configuration information. Memory 124 may be accessed via interface 134 during, for example, configuration of regulator 100. Configuration block 104 may also be used to control various functions of loop controllers 110 and 114. For example, configuration block 104 may be used to enable/disable, or change the operating parameters of loop controllers 110 and 114, as may be required by the specific final configuration of regulator 100.

Figure 2A:
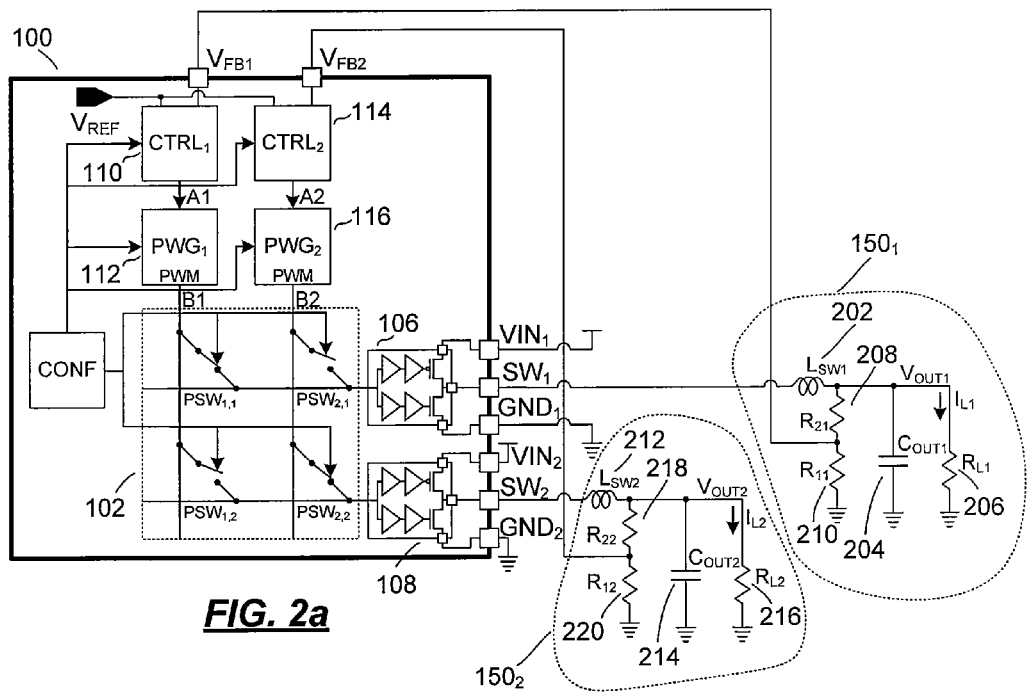
FIG. 2A shows the power supply voltage regulator of FIG. 1 configured to supply two output voltages.

FIG. 2a shows regulator 100 configured to supply two output voltages VOUT1 and VOUT2, in accordance with one example. CM 102 is configured to route PWM signal B1 to output stage 106, and PWM signal B2 to output stage 108. To achieve this, switches $PSW_{1,1}$ and $PSW_{2,2}$ are closed, and switches $PSW_{1,2}$ and $PSW_{2,1}$ are open. Accordingly, feedback voltage $V_{FB1}$ representative of output voltage VOUT1 is regulated by the closed loop formed by controller 110, PWG 112, switch $PSW_{1,1}$ and output stage 106. Similarly, feedback voltage $V_{FB2}$ representative of output voltage VOUT2 is regulated by the closed loop formed by controller 114, PWG 116, switch $PSW_{2,2}$ and output stage 108. It is understood that switches $PSW_{2,1}$ and $PSW_{1,2}$ are open to achieve this configuration.

Components collectively identified using reference numeral $150_1$ and $150_2$ are externally supplied to ensure proper operation of regulator 100. Referring, for example, to block $150_1$, resistors 208 and 210 divide the output voltage VOUT1 to generate a feedback voltage $V_{FB1}$ that is supplied to controller 110. Accordingly, voltage VOUT1 is defined by the following expression:

$$VOUT1 = V_{REF} * (R1+R2)/R1 \quad (1)$$

where R1 and R2 are the resistances of resistors 112 and 114, respectively.

Resistor 206, having the resistance $R_{L1}$, represents the load seen by output stage 106. Output capacitor 204, having the capacitance $C_{OUT1}$, is used to maintain loop stability and to keep output voltage VOUT1 relatively constant during load transients. Capacitance $C_{OUT1}$ is typically selected to have a relatively large value to keep output voltage VOUT1 within a predefined range while the feedback loop responds and regains control in response to a load transient. Block $150_2$ is similar to block $150_1$ except that it is coupled to output stage 108.

Figure 2B:
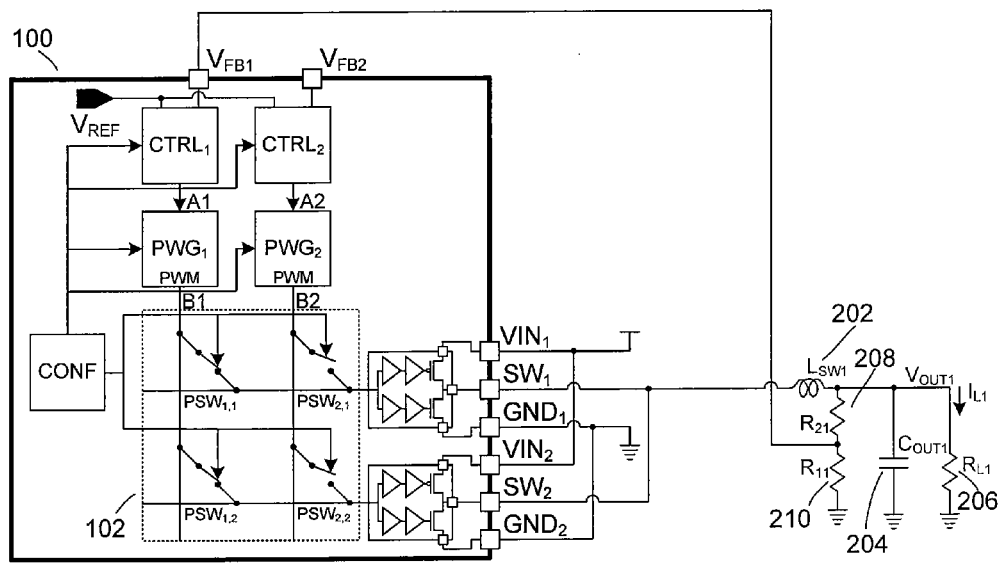
FIG. 2B shows the power supply voltage regulator of FIG. 1 configured to supply two output voltages.

FIG. 2b shows regulator 100 that is configured to generate a single output voltage VOUT1, in accordance with another example. In this example, output stages 106 and 108 are coupled to one another in parallel, for example, on a printed circuit board (PCB), where the regulator 100 IC is mounted. In the example shown in FIG. 2b, control loop 114 and PWG 116 are not used. Accordingly, CM 102 is configured to route the PWM signal B1 to both output stages 106 and 108. As a result, only a first output voltage VOUT1 is regulated by the feedback loop formed by loop controller 110, PWG 112, closed switches $PSW_{1,1}$ and $PSW_{1,2}$ and output Drivers 106 and 108. In this case the output current capability of the power supply is increased since two output stages 106, and 108 are used in paralleled.

As seen from the examples shown in FIGS. 2a and 2b, a power supply IC, in accordance with the present invention, may be configured to generate different number of regulated output voltages by supplying control bits to CM 102 and by configuring the output stage and feedback connection pattern on the PCB. The power supply needs of a variety of systems is thus fulfilled by only one IC of the present invention which can be programmed before being mounted on the PCB, or can be programmed during the board level testing after PCB assembly.

Figure 3:
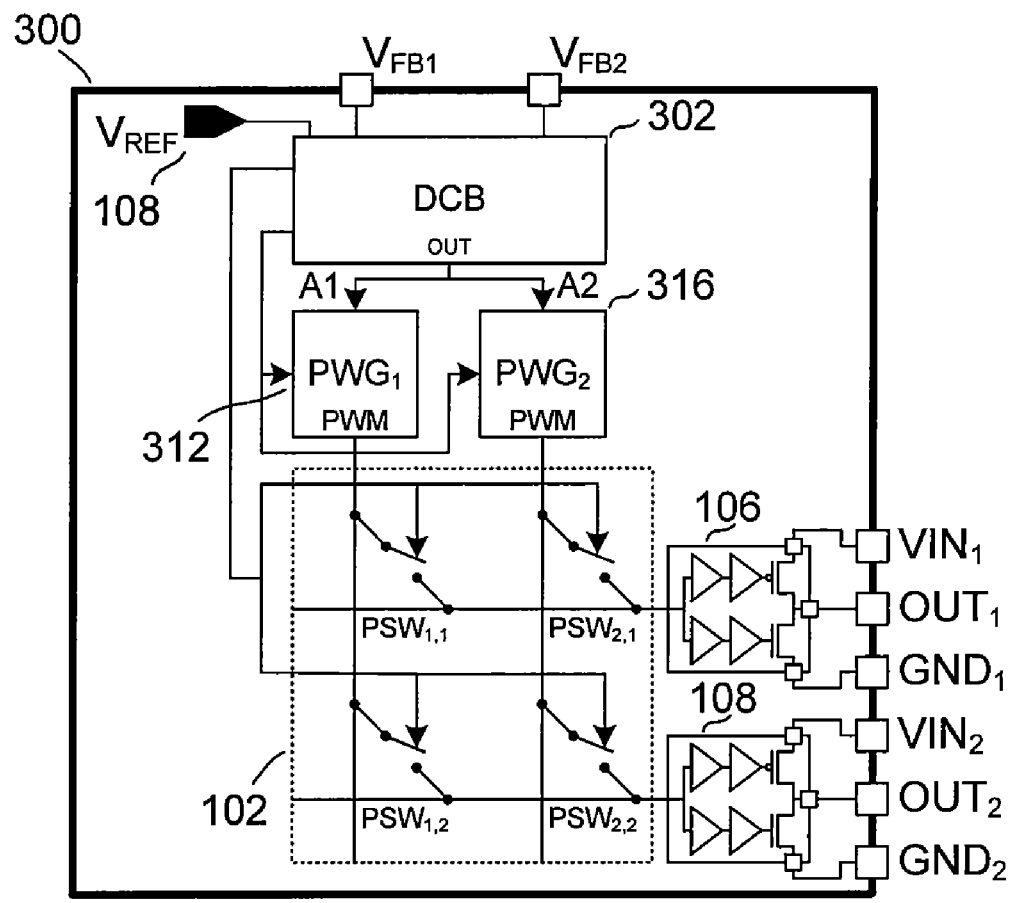
FIG. 3 is an exemplary block diagram of a configurable power supply voltage regulator, in accordance with another embodiment of the present invention.

FIG. 3 is a block diagram of a configurable power supply voltage regulator integrated circuit 300, in accordance with another exemplary embodiment of the present invention. Regulator 300 implements voltage mode control and includes a digital control block (DCB) 302 that performs the functions associated with loop controllers 110 and 114 and configuration block 104 of regulator 100 of FIG. 1. DCB 302 receives the feedback signals $V_{FB1}$, $V_{FB2}$ and generates PWG control signals A1 and A2 in a time multiplexed manner. Because DCB 302 is a digital circuit operating in a time-multiplexed manner, regulator 300 has an enhanced flexibility, and provides substantial savings in die size.

Figure 4:
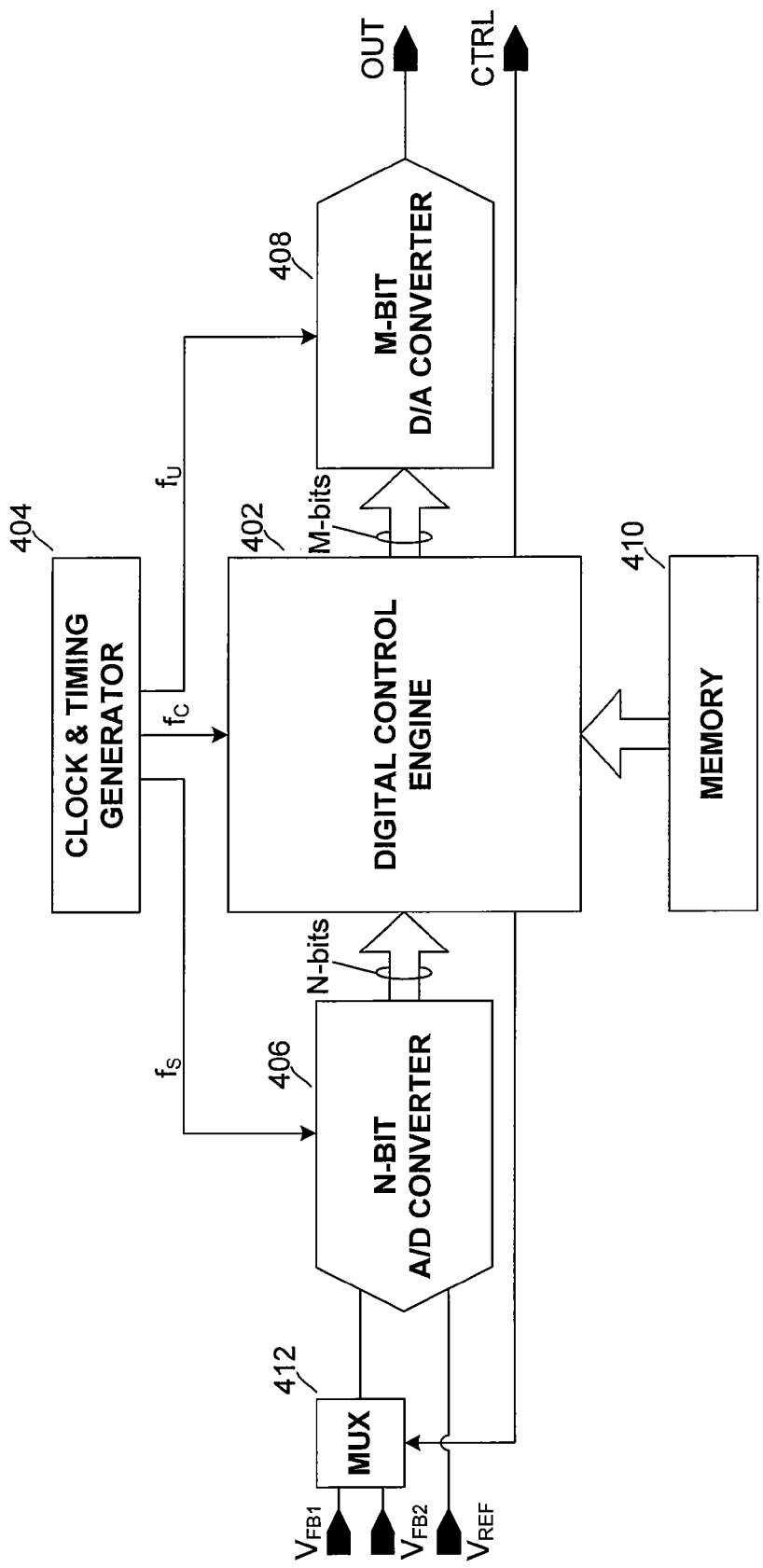
FIG. 4 is an exemplary block diagram of the digital control block disposed in configurable power supply voltage regulator of FIG. 3.

FIG. 4 is a block diagram of DCB 302, in accordance with one embodiment of the present invention. Multiplexer (MUX) 412 receives feedback signals FB1 and FB2 and selectively delivers one of these two signals to N-bit analog-to-digital (A/D) 406. Referring concurrently to FIGS. 3 and 4, N-Bit Analog-to-Digital Converter (ADC) 406 is shown as having differential inputs and a sampling rate of $f_S$. In other embodiments, described below, ADC 406 may have a single-ended input. ADC 406 samples the voltage difference between reference voltage $V_{REF}$ and feedback voltage $V_{FB}$ and converts this difference to a corresponding N-bit wide digital code word at its output.

The Digital Control Engine (DCE) 402 receive the N-bit wide digital code word from ADC 406 and processes it according to a control algorithm to provide an M-bit wide digital code word that is supplied to Digital-to-Analog Converter (DAC) 408. The algorithm implemented by DCE 402 may be a digital filter algorithm mimicking the behavior of a high-gain low-bandwidth amplifier, such as an integrator, or may be a non-linear function adapted to bring the feedback voltage $V_{FB}$ close to reference voltage $V_{REF}$ such that the difference between voltages $V_{FB}$ and $V_{REF}$ is less than a predefined value. DAC 408 uses the M-bit word to bring the output voltage into regulation. The resolution of ADC 306, i.e., N, is typically selected so as to be less than the DAC 308 resolution, i.e., M, to avoid limit cycling of the output voltage. DAC 408 generates an analog voltage signal at its output in response to the M-bit wide digital code word it receives at its input. The voltage generated by DAC 408 is applied to an input terminal of amplifier 104. Signal CTRL generated by DCE 402 is optionally used to control the operations of one or more blocks of voltage regulator 300 of the present invention. For example, signal CTRL may be used to set the bias currents/voltages to optimize the performance of the various analog blocks disposed in regulator 300 of the present invention to account for environment parameters, external component values and operating conditions.

Memory 410 supplies information to DCE 402. Although not shown, in one embodiment, memory 410 includes a non-volatile (NVM) and a volatile Memory (VM). The NVM may be used to store such data as, e.g., calibration information, loop parameters, external component values and parameters for the programmable features of the regulator that are desired to be retained in case of a power loss. VM may be used as a scratch pad by the DCE 302 and may also store run-time status information. The Clock & Timing Generator 404 generates the timing signals for the ADC 306, DCE 302, DAC 308, and memory 310. The ADC sample rate and the DAC update rate, as well as the DCE clock speed are selected to support the desired loop transfer function and timing characteristics.

Although not shown, the time multiplexing of the DCB may be extended to more than two voltage regulation channels. Additionally, the ADC 306, DAC 308, and DCE 302 disposed in the DCB, can be further utilized by other purposes when they are needed to process data, such as diagnostics, supervisory functions, and communications.

In one embodiment, ADC 406 has a single-ended input and may sample the signals $V_{REF}$ and $V_{FB}$ signals at different times, store them in MEM 410, and compute the difference in digital domain. In another embodiment, the difference between the values of signals $V_{REF}$ and $V_{FB}$ may be determined by an analog signal conditioning circuit. The output of the signal conditioning circuit is then applied to the single-ended ADC 406. The DAC 408 receives the M-bit wide digital code word at its input and converts it to an analog voltage at its output. This voltage in turn is applied to the Pulse Width Generators 312 and 316.

Figure 5A:
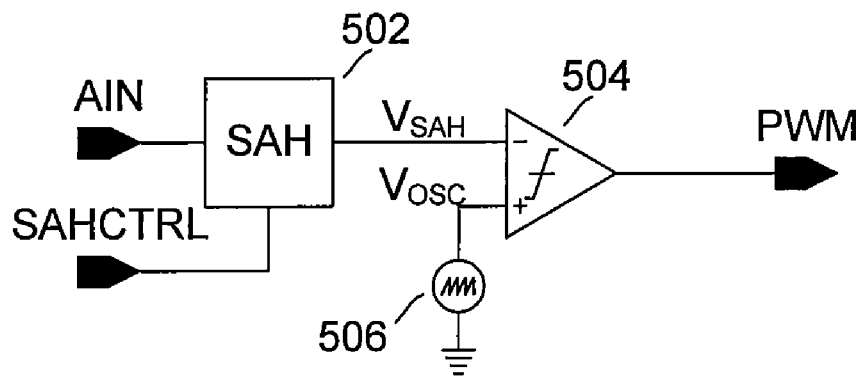
FIG. 5A is an exemplary block diagram of a pulse width generator used in configurable power supply voltage regulators of FIGS. 1 and 3.
Figure 5B:
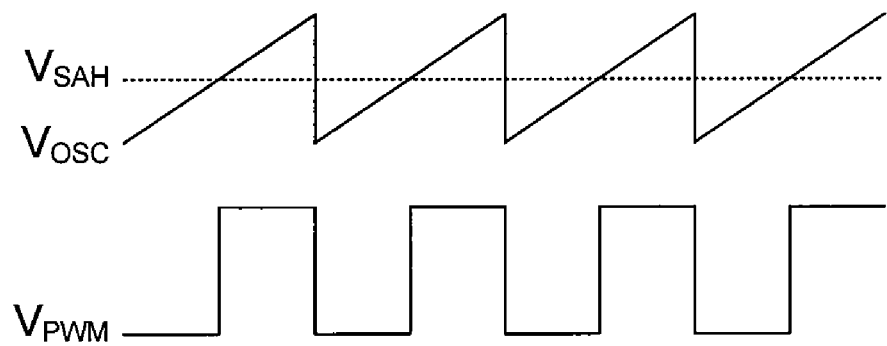
FIG. 5B is a timing diagram of a number of signals associated with the pulse-width generator of FIG. 5A.

FIG. 5A is a block diagram of pulse width generators 112, 116 as used in regulator 300. Each pulse width generator is shown as including a sample-and-hold block (SAH) 502 and a comparator 504. SAH 502 samples the voltage AIN generated by the DAC 408, at an instant controlled by the DCB 302 using signal SAHCTRL. Voltage signal $V_{SAH}$ generated by SAH 502 sets a threshold level at the negative input of Comparator 504. Oscillator 506 generates a ramp at the positive input of Comparator 504. When the ramp signal $V_{OSC}$ crosses the threshold level set by $V_{SAH}$, Comparator 504 trips and a PWM signal is generated at its PWM output. FIG. 5B is a timing diagram of signals $V_{SAH}$, $V_{OSC}$ applied to comparator 504, as well as signal $V_{PWM}$ generated by comparator 504. The width of the pulse $V_{PWM}$ is controlled by $V_{SAH}$ which, in turn, is generated by the DAC 408 in response to a digital code word computed by the DCE 402 to maintain the output voltage in regulation.

Figure 6:
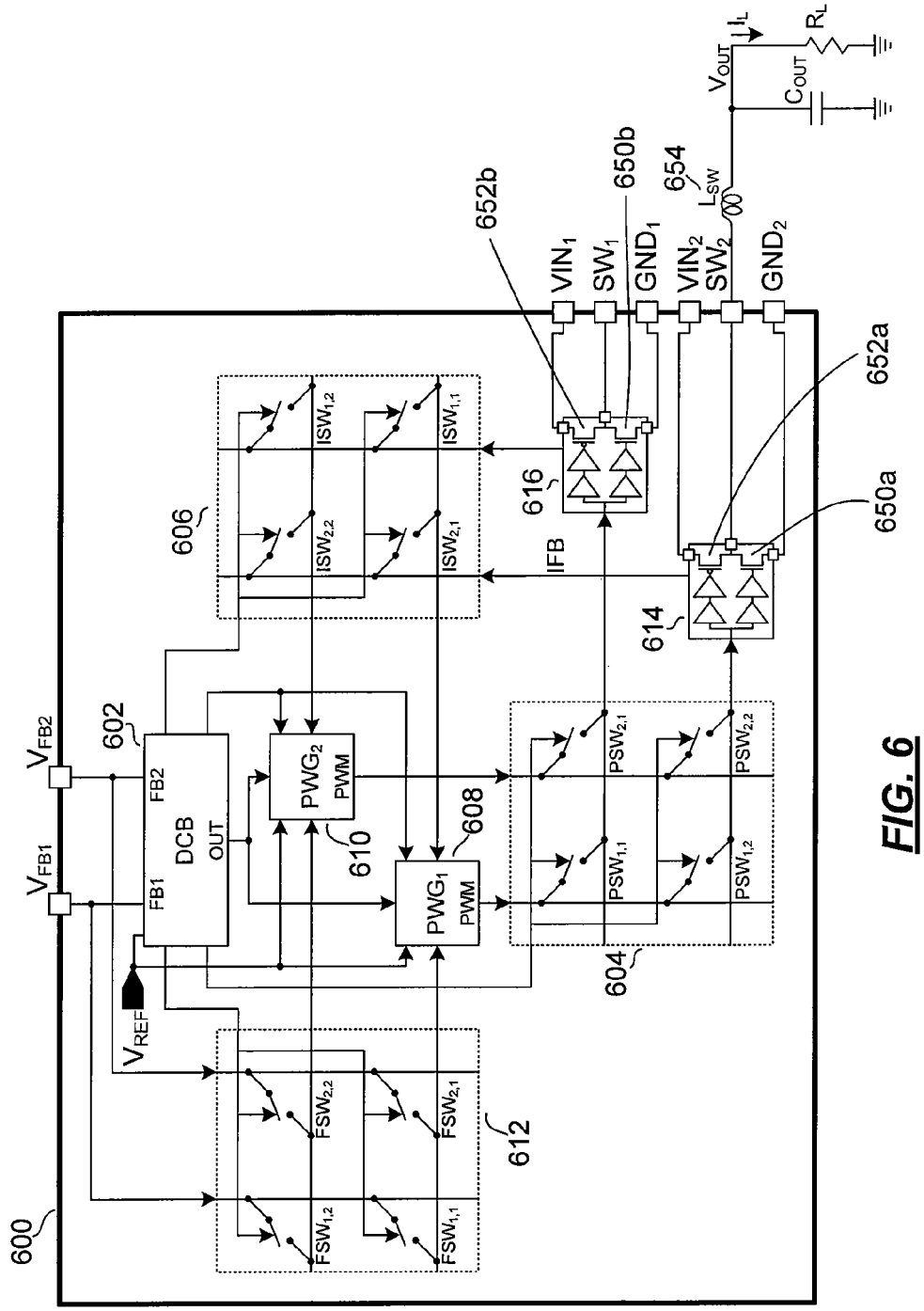
FIG. 6 is a block diagram of a configurable power supply voltage regulator integrated circuit, in accordance with another exemplary embodiment of the present invention.

FIG. 6 is a block diagram of a configurable power supply voltage regulator integrated circuit 600, in accordance with another exemplary embodiment of the present invention. In regulator 600, loop control functions are performed by digital control block (DCB) 602 which monitors the feedback signals from different output stage and generates PWG control signals at its output in a time multiplexed way.

Regulator 600 also includes a current feedback routing matrix (CFRM) 606 that receives feedback current signals from output stages 614 and 616 and selectively routes these current feedback signals to pulse width generators 608 and 610. Regulator 600 also includes a voltage feedback routing matrix (CFRM) 612 that receives feedback voltage signals $V_{FB1}$ and $V_{FB2}$ from output stages 614 and 616 and selectively routes these voltage feedback signals to pulse width generators 608 and 610. Configuration matrix 604 routes the PWM signals generated by PWG 608 and 610 to the inputs of the output stages 614 and 616 to close the feedback loops. FIG. 4 is also a block diagram of DCB 600. Although not explicitly shown, signal CTRL generated by the DCE disposed in DCB 602 controls the configurations of the CM 604, CFRM 606, and VFRM 612, as well as the sample-and-hold blocks disposed in PWG 608 and 610.

Figure 7:
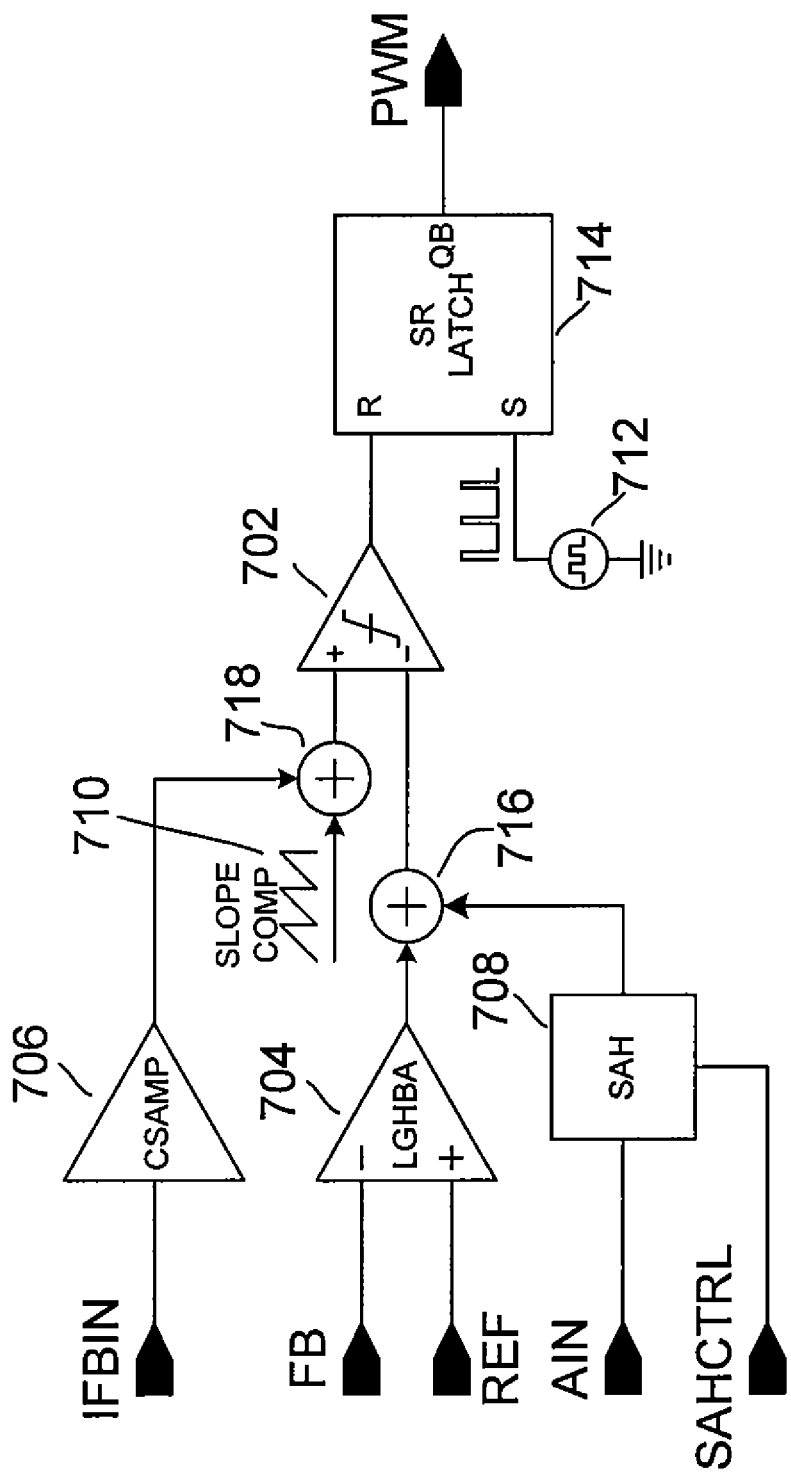
FIG. 7 is a block diagram of the pulse-width generators disposed in FIG. 6, in accordance with another exemplary embodiment of the present invention.

FIG. 7 is a block diagram of pulse-width generators 608 and 610 of FIG. 6, implementing Current Mode control. The switching cycle begins with the Oscillator 712 setting the SR Latch 714. Output signal PWM of SR Latch 714 is routed through CM 604 to an output stage where it is buffered and applied to the low-side switch (LSS) and a high-side switch (HSS). For example, if the output signal of SR latch 714 is routed to output stage 614, it is applied to low-side switch 650a and to high-side switch 652a.

Referring concurrently to FIGS. 6 and 7, assume that the output signal of SR latch 714 is applied to output stage 614. Accordingly, when the SR Latch 714 is set, the HSS 652a is turned on and its current equals the current of the inductor 654 connected to the SW2 output of that output stage, which in turn nearly equals the load current IL of that output. A current feedback signal $I_{FB}$ representative of the HSS 652a current is generated in the output stage and applied to the CFM 606 of the pulse-width generator of FIG. 7. CFM 606 delivers the current feedback signal $I_{FB}$ to input terminal IFBIN of current sense amplifier (CSAMP) 706. A slope compensation signal 710 is added to the output signal of current sense amplifier 706, and the sum of these signals is applied to a positive input terminal of comparator 702. Slope compensation signal 710 helps avoid sub-harmonic oscillations when the duty-cycle is larger than 50%. The resulting voltage at the positive input terminal of Comparator 702 is compared to a threshold voltage applied to the negative input terminal of comparator 702. As the inductor 654 current builds up, at some point the voltage at the positive input of Comparator 702 reaches the threshold voltage set at its negative input and the Comparator 702 trips, resetting the SR Latch 714, which in turn turns off the HSS 652a and turns on the LSS 650a. The cycle repeats itself with the next clock pulse from the Oscillator 712. This type of current mode control is commonly referred to as peak current control.

The threshold voltage level at the negative input of comparator 702 is developed as a function of the difference between Reference voltage $V_{REF}$ and the voltage at the feedback terminal $V_{FB}$ of the regulator. Amplifier 704 is a Low Gain High Bandwidth Amplifier (LGHBA) and together with the current loop described above forms a low gain, high bandwidth sub-loop which is responsible for the fast transient response of the Switching Regulator Circuit. SAH 708 receives the control signal generated by the DCB 602. The DCB 602 may be characterized as a high-gain, low-bandwidth amplifier and provides the DC accuracy of the voltage regulators described above.

It is understood that the same operation can be achieved by reversing both the signal polarities and the comparator terminals to which they are applied. In some embodiments, oscillators 506 and 712 disposed in PWGs associated with different output stages may run at the same frequency but at different phases to provide outputs in a multi-phase switching regulator. In some embodiments, the output stages may drive external discrete transistors to increase output current capability.

Figure 8:
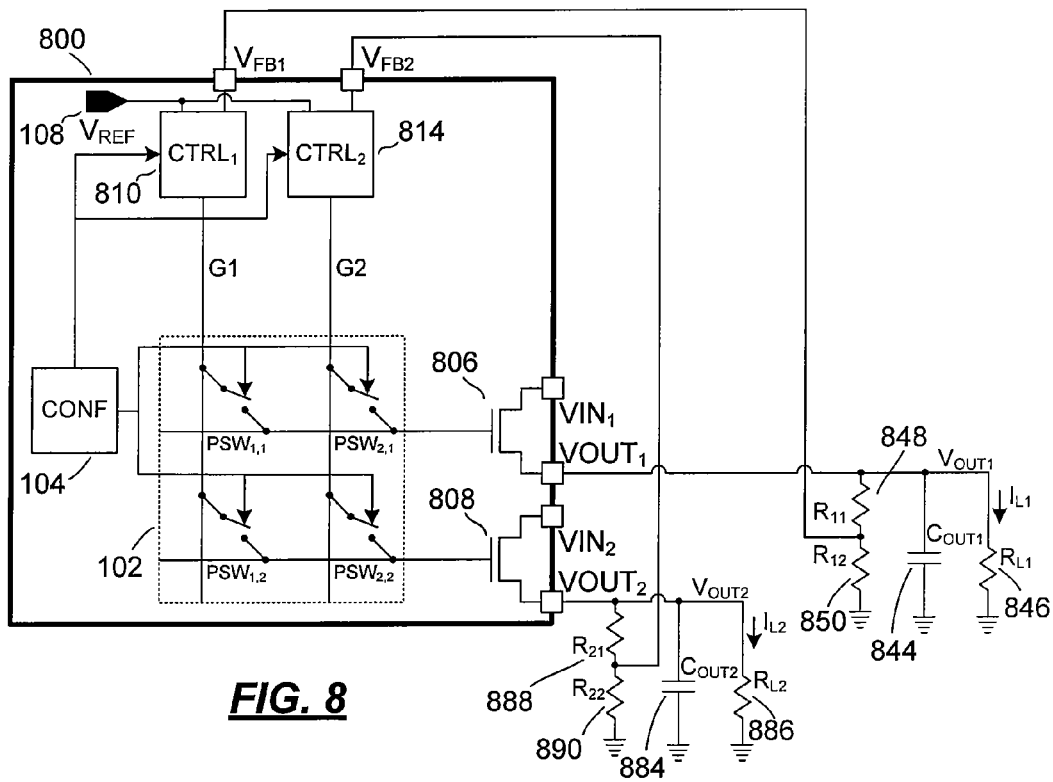
FIG. 8 is a block diagram of a configurable power supply voltage regulator integrated circuit, in accordance with another exemplary embodiment of the present invention.

FIG. 8 is a block diagram of a configurable power supply voltage regulator 800. Regulator 800, which is a linear voltage regulator, is shown as including, in part, loop controllers 810, 814, configuration matrix 102, and series pass elements 806 and 808. Regulator 800 is also shown as having disposed therein a configuration block 104. It is understood however that configuration block 104 may be external to regulator 800. Each of the series pass element includes a unit sized transistor which may be an NMOS, PMOS, PNP or NPN transistor. The unit size is defined with respect to the performance parameter targets of the regulator. The unit size can be chosen to deliver, for example, 100 mA load current under a certain input voltage condition. Series pass elements 806 and 808 do not need to have identical sizes. For example, pass element 806 may be sized for 100 mA load current, whereas pass element 808 may be sized for 200 mA.

Each loop controller receives a feedback voltage and a reference voltage, and in response generates a gate drive voltage at its output terminal. For example, loop controller 810 is shown as receiving voltage feedback signal $V_{FB1}$ and reference voltage $V_{REF}$, and in response generating gate control signal G1. Similarly, loop controller 814 is shown as receiving voltage feedback signal $V_{FB2}$ and reference voltage $V_{REF}$, and in response generating gate control signal G2. Configuration Matrix (CM) 102 includes a multitude of switches adapted to selectively supply gate control signals G1 and G2 to output stages 806 and 808.

Figure 9:
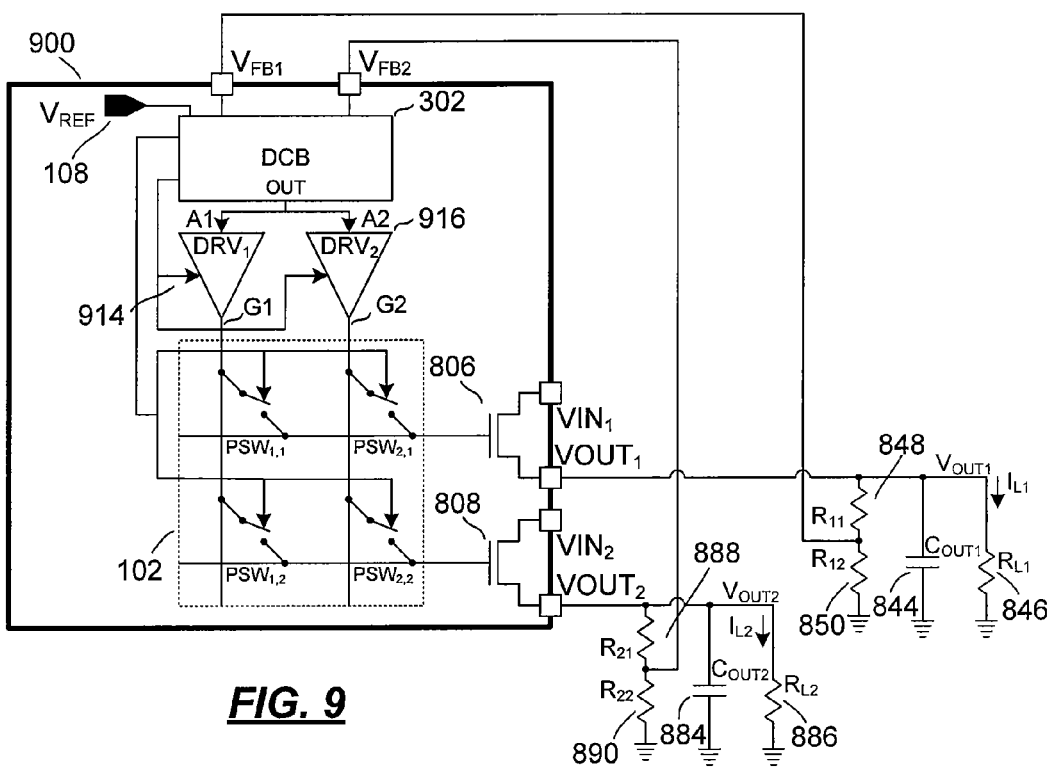
FIG. 9 is a block diagram of a configurable power supply voltage regulator integrated circuit, in accordance with another exemplary embodiment of the present invention.

FIG. 9 is a block diagram of a configurable power supply voltage regulator integrated circuit 900, in accordance with another exemplary embodiment of the present invention. Regulator 900, which is a linear voltage regulator, includes a digital control block (DCB) 302 that performs the functions associated with loop controllers 810 and 814 and configuration block 104 of regulator 800 of FIG. 8. DCB 302 receives the feedback signals $V_{FB1}$, $V_{FB2}$ and generates control signals A1 and A2 in a time multiplexed manner. Control signals are further amplified by drivers 914 and 916, resulting in gate drive signals G1 and G2 respectively, which are applied to the configuration matrix 102. Because DCB 302 is a digital circuit operating in a time-multiplexed manner, regulator 300 has an enhanced flexibility, and provides substantial savings in die size.

Figure 10:
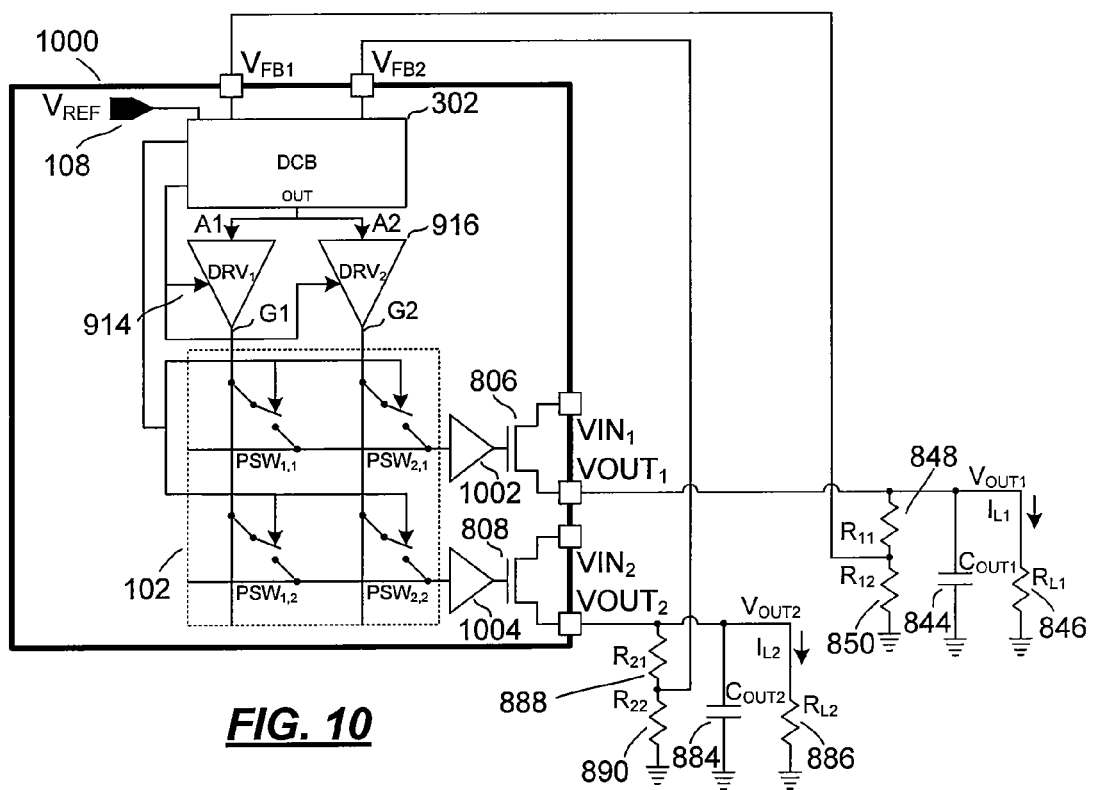
FIG. 10 is a block diagram of a configurable power supply voltage regulator integrated circuit, in accordance with another exemplary embodiment of the present invention.

FIG. 10 is a block diagram of a configurable power supply voltage regulator integrated circuit 1000, in accordance with another exemplary embodiment of the present invention. Regulator 1000, which is a linear voltage regulator, includes a digital control block (DCB) 302 that performs the functions associated with loop controllers 810 and 814 and configuration block 104 of regulator 800 of FIG. 8. DCB 302 receives the feedback signals $V_{FB1}$, $V_{FB2}$ and generates control signals A1 and A2 in a time multiplexed manner. Control signals are further amplified by drivers 914 and 916, resulting in gate drive signals G1 and G2 respectively, which are applied to the configuration matrix 102. The buffers 1002 and 1004 receive their inputs from the configuration matrix 102 and drive the input terminals of the series pass elements 806 and 808. Buffers 1002 and 1004 are used in reducing the loading of the configuration matrix 102 directly by the series pass elements 806 and 808 which would otherwise adversely affect feedback loop characteristics.

The above embodiments of the present invention are illustrative and not limiting. Various alternatives and equivalents are possible. The invention is not limited by the type of amplifier, pulse-width generator, feedback circuit, configuration matrix, switch, etc. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present disclosure and are intended to fall within the scope of the appended claims.

What is claimed is:

1. A voltage regulator circuit comprising:
   at least first and second output stages;
   a digital control block;
   at least first and second pulse-width generators; and
   a configuration matrix including a plurality of switches operable to selectively couple the first and second pulse width generators to the first and second output stages or to selectively uncouple the first and second pulse width generators from the first and second output stages;
   wherein:
   said digital control block is operable to receive a reference signal and a first feedback signal and to generate a first internal signal operative to cause a difference between the first feedback signal and the reference signal to be less than a predefined value, said first feedback signal being representative of a first regulated output voltage
   said digital control block is further operable to receive the reference signal and a second feedback signal and to generate a second internal signal operative to cause a difference between the second feedback signal and the reference signal to be less than a predefined value, said second feedback signal being representative of a second regulated output voltage
   said at least first pulse-width generator is operable to generate at least a first pulse having a width defined in part by a level of the first internal signal,
   said at least second pulse-width generator is operable to generate at least a second pulse having a width defined in part by a level of the second internal signal,
   wherein in response to a configuration data received by the configuration matrix the plurality of switches cause the first pulse-width generator to be coupled to the first output stage and the second pulse-width generator to be coupled to the second output stage, thereby causing:
   said at least first pulse to be applied to the first output stage thus causing the first regulated output voltage to be supplied at an output of a first LC lowpass filter when the first LC lowpass filter is coupled to the first output stage, and said at least second pulse to be applied to the second output stage thus causing the second regulated output voltage to be supplied at an output of a second LC lowpass filter when the second LC lowpass filter is coupled to the second output stage.

2. The voltage regulator circuit of claim 1 wherein the digital control block comprises:

at least one analog-to-digital converter adapted to convert the first and second feedback signals to first and second digital feedback signals; and a digital control engine adapted to digitally compute pulse width information of each of first and second internals signals in response to said at least one analog-to-digital converter.

3. The voltage regulator circuit of claim 2 wherein said digital control block further comprises:

a memory storing the configuration data.

4. The voltage regulator circuit of claim 2 wherein said digital control block further comprises:

a memory storing the configuration data.

5. The voltage regulator circuit of claim 1 wherein each output stage includes at least one switching transistor implementing a switching regulator.

6. A voltage regulator circuit comprising:

a digital control block;

at least first and second pulse-width generators;

at least a first output stage including a first output node;

at least a second output stage including a second output node; and a configuration matrix including a plurality of switches operable to selectively couple the first and second pulse width generators to the first and second output stages or to selectively uncouple the first and second pulse width generators from the first and second output stages; wherein said digital control block is operable to receive a reference signal and a first feedback signal and to generate a first internal signal operative to cause a difference between the first feedback signal and the reference signal to be less than a predefined value, said first feedback signal being representative of a regulated output voltage, said at least first pulse-width generator is operable to generate at least a first pulse having a width defined in part by a level of the first internal signal, wherein in response to a configuration data received by the configuration matrix the plurality of switches cause the first pulse-width generator to be coupled to the first output stage and the second output stage, thereby causing said at least first pulse to be applied to the first and second output stages thus causing the regulated output voltage to be supplied at an output of an LC lowpass filter when the LC lowpass filter is coupled to a common output node, said common output node formed by connecting the first and second output nodes together.

7. The voltage regulator circuit of claim 6 wherein the digital control block comprises:

at least one analog-to-digital converter; and a digital control engine adapted to generate the first internal signal in response to said at least one analog-to-digital converter.

* * * * *